(12) United States Patent  
Seifert

(10) Patent No.: US 12,056,318 B2
(45) Date of Patent: Aug. 6, 2024

(54) BLACK COLORED OBJECT HAVING AN ELECTROMAGNETIC OR ELECTRIC FIELD FUNCTION

(71) Applicant: CONTINENTAL AUTOMOTIVE GMBH, Hannover (DE)

(72) Inventor: Klaus Seifert, Darmstadt (DE)

(73) Assignee: Continental Automotive GmbH, Hannover (DE)

( * ) Notice: Subject to any disclaimer, the term of this patent is extended or adjusted under 35 U.S.C. 154(b) by 244 days.

(21) Appl. No.: 17/113,673

(22) Filed: Dec. 7, 2020

(65) Prior Publication Data
US 2021/0089167 A1 Mar. 25, 2021

Related U.S. Application Data

(63) Continuation of application No. PCT/EP2019/064988, filed on Jun. 7, 2019.

(30) Foreign Application Priority Data

Jun. 7, 2018 (DE) ............. 10 2018 209 085.8
Oct. 2, 2018 (DE) ............. 10 2018 216 897.0

(51) Int. Cl.
*G06F 3/044* (2006.01)
*G09G 3/36* (2006.01)
*H03K 17/96* (2006.01)

(52) U.S. Cl.
CPC ............ *G06F 3/0443* (2019.05); *G06F 3/044* (2013.01); *G09G 3/3607* (2013.01);
(Continued)

(58) Field of Classification Search
CPC ......... G06F 3/0443; G06F 2203/04107; G06F 3/044–0448; G09G 3/3607;
(Continued)

(56) References Cited

U.S. PATENT DOCUMENTS

2004/0057198 A1\* 3/2004 Kahl ................. H05K 9/0015
361/679.01
2005/0045069 A1\* 3/2005 McCarthy ............... C04B 28/02
106/714
(Continued)

FOREIGN PATENT DOCUMENTS

BE 0048117 A2 \* 3/1982 ............ C08G 18/00
CN 101835624 A \* 9/2010 ........ B41M 5/38207
(Continued)

OTHER PUBLICATIONS

International Search Report and Written Opinion dated Jan. 29, 2020 from corresponding International Patent Application No. PCT/EP2019/064988.
(Continued)

*Primary Examiner* — Benjamin C Lee
*Assistant Examiner* — Nathan P Brittingham

(57) ABSTRACT

In the case of a black-colored object having an electromagnetic or electric field function, wherein the black-colored object is colored by means of pigments, is covered with a component colored by means of pigments, or is coated with a lacquer, wherein the lacquer includes pigments, provision is made for the pigments to be electrically non-conductive.

5 Claims, 5 Drawing Sheets

(52) U.S. Cl.
CPC . *H03K 17/962* (2013.01); *G06F 2203/04107* (2013.01); *G09G 2380/10* (2013.01); *H03K 2017/9602* (2013.01); *H03K 2217/960765* (2013.01)

(58) Field of Classification Search
CPC ............. G09G 2380/10; H03K 17/962; H03K 2017/9602; H03K 2217/960765
USPC ........................................ 345/173; 178/18.06
See application file for complete search history.

(56) References Cited

U.S. PATENT DOCUMENTS

| | | | |
|---|---|---|---|
| 2007/0229365 A1 | 10/2007 | Treutlein et al. | |
| 2010/0167035 A1 | 1/2010 | Striegler | |
| 2011/0128241 A1* | 6/2011 | Kang | G06F 3/0486 |
| | | | 345/173 |
| 2012/0125315 A1 | 5/2012 | Alonso Esteban et al. | |
| 2013/0086389 A1* | 4/2013 | Suwald | G07F 7/084 |
| | | | 713/185 |
| 2014/0048115 A1* | 2/2014 | Kirihara | G06F 3/041 |
| | | | 136/229 |
| 2015/0041303 A1 | 2/2015 | Cao | |
| 2015/0092123 A1 | 4/2015 | Gotoh et al. | |
| 2018/0123221 A1* | 5/2018 | Finn | H01Q 1/2225 |

FOREIGN PATENT DOCUMENTS

| | | | | |
|---|---|---|---|---|
| CN | 102662543 | A | 9/2012 | |
| CN | 103455224 | A | 12/2013 | |
| DE | 102004026672 | A1 | 12/2005 | |
| DE | 102007062945 | A1 | 6/2009 | |
| DE | 102008058318 | B3 | 6/2010 | |
| DE | 102009004783 | A1 | 7/2010 | |
| EP | 1841004 | A1 | 10/2007 | |
| JP | 2014024316 | A | 2/2014 | |
| TW | 201020887 | A * | 6/2010 | ........... G02B 6/0076 |
| WO | 2009083165 | A1 | 7/2009 | |
| WO | 2011020719 | A1 | 2/2011 | |
| WO | 2019008109 | A1 | 1/2019 | |

OTHER PUBLICATIONS

Office Action dated Sep. 29, 2023 from corresponding Chinese patent application No. 201980038095.7.

* cited by examiner

FIG 8
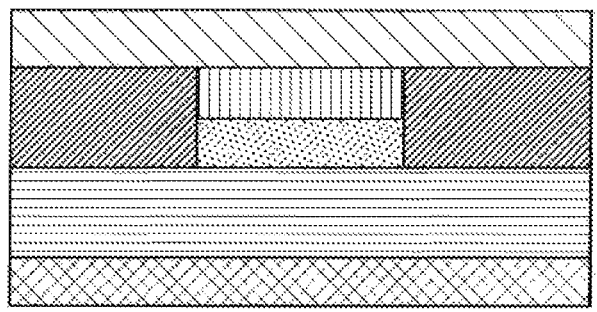
⇧ Light ⇧
| Legend | |
|---|---|
| Film (transparent) | |
| Spinel black | |
| Translucent black print */** | |
| Color-imparting print | |
| Plastic (injection molded) | |
| Touch sensor system | |
\* The translucent black print can be realized with spinel or other pigments or colorants
Day design     Night Design (backlit)

FIG 9

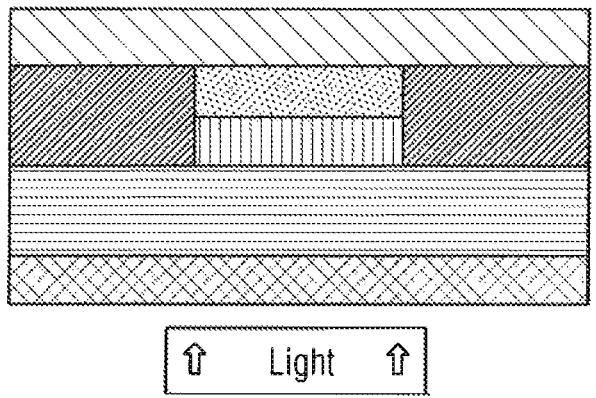

↑ Light ↑

| Legend | |
|---|---|
| Film (transparent) | |
| Spinel black | |
| Translucent black print * | |
| Color-imparting print | |
| Plastic (injection molded) | |
| Touch sensor system | |
| Night color ** | |

\* The translucent black print can be realized with spinel or other pigments or colorants \*\* Night color can be omitted if the color impression when illuminated can be achieved by the color-imparting print or is produced by the light-emitting means

 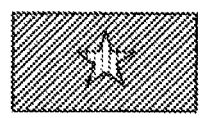

Day design    Night design (backlit)

FIG 10
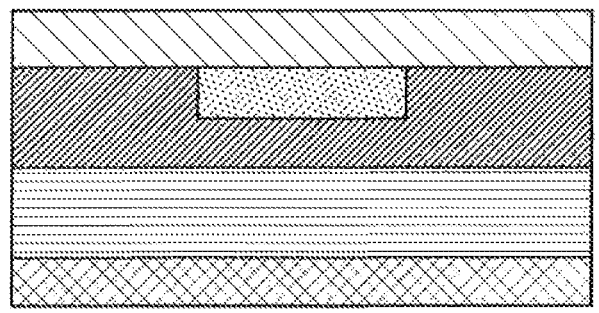
| Legend | |
|---|---|
| Film (transparent) | |
| Spinel black | |
| Color-imparting print* | |
| Plastic (injection molded)** | |
| Touch sensor system** | |
\* The color-imparting print can include a plurality of identical or different prints
\*\* Plastic and touch sensor system can be transparent/translucent or opaque
Day design

BLACK COLORED OBJECT HAVING AN ELECTROMAGNETIC OR ELECTRIC FIELD FUNCTION

CROSS-REFERENCE TO RELATED APPLICATIONS

This U.S. patent application claims the benefit of PCT patent application No. PCT/EP2019/064988, filed Jun. 7, 2019, which claims the benefit of German patent application No. 10 2018 209 085.8, filed Jun. 7, 2018, and German patent application No. 10 2018 216 897.0, filed on Oct. 2, 2018, all of which are hereby incorporated by reference.

TECHNICAL FIELD

The invention relates to a black-colored object having an electromagnetic or electric field function, for use in, with, or around vehicles

BACKGROUND

An electromagnetic or electric field function for a black-colored object comprises a data transfer function. The black-colored object is colored by pigments or is covered with a component colored by pigments or is coated with a lacquer, wherein the lacquer includes pigments. The data transfer function may be implemented by changing the electromagnetic and/or electric field.

Objects of this type are known from the prior art, for example as motor vehicle antennas, as motor vehicle sensors, or as operating systems with capacitive input surfaces. Carbon black particles are usually used as pigments for black colorations or black lacquers. The carbon black particles can, however, restrict or even prevent the electromagnetic or electric field function of the relevant components.

It is therefore useful to specify pigments for black colorations or black lacquers that prevent or at least reduce any impairment of the electromagnetic or electric field function.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

An object may include pigments that are also electrically non-conductive pigments to at least reduce any impairment of the electromagnetic or electric field function. As a result, the use of carbon black particles can be partially or even completely dispensed with and the electromagnetic or electric field functions and the data transfer function can thus be improved.

If the use of carbon black particles is completely dispensed with and only non-conductive pigments are used, the electromagnetic and the electric field functions of the black-colored objects are impaired the least. The joint use of both conductive and non-conductive pigments can be more cost-effective, but the electric and magnetic field functions may then be restricted.

Spinel pigments have proven to be particularly suitable pigments. They achieve good magnetic and electric field properties with a good visual appearance.

Copper-chromium-iron-spinel pigments or chromium-iron-nickel-manganese-spinel pigments prove to be particularly suitable for black lacquers or colorations.

A black-colored object with an electric field function can be embodied in the form of an operating apparatus with a capacitive input surface, wherein the capacitive input surface is one of colored by pigments, covered with a component colored by pigments, and/or is coated with a lacquer, wherein the lacquer includes pigments.

If the operating apparatus has a component with conductive pigments and a component with non-conductive pigments, which are arranged directly adjacent to one another or at a distance from one another, money can be saved because conductive pigments in the form of carbon black particles are cheaper than non-conductive particles in the form of, for example, spinel pigments. The components can here each be embodied in the form of a separate first and second component. It is also possible to design a second component as a lacquer that contains a second pigment with which the first component is painted. In the two aforementioned embodiments, for example, the first pigment is conductive and the second pigment is non-conductive. The two components increase the black coloration of the capacitive input surface overall.

Furthermore, the operating apparatus can be embodied as part of a transmitting and/or receiving device for electromagnetic radiation. Here, a structural unit with the aforementioned operating apparatus and the transmitting and/or receiving device for electromagnetic radiation has a housing, wherein parts of the housing are advantageously embodied in such a way that they attenuate electromagnetic radiation as well as possible, in particular parts that face a user of the structural unit when the transmitting and/or receiving device is used, and parts of the structural unit that face away from the user during use of the structural unit allow the electromagnetic radiation to pass through as freely as possible, wherein said aforementioned properties are realized by a corresponding selection of the pigments.

In another exemplary embodiment, the capacitive input surface can be colored with conductive pigments, for example, or be painted with a lacquer with conductive pigments and then the electrodes of the capacitive input surface can, in the first case, be arranged on the capacitive input surface and, in the second case, be arranged on the lacquer, which electrodes are then covered in the direction of an operator of the operating apparatus with a lacquer or a component with in each case non-conductive pigments. The operating apparatus is then electromagnetically shielded by the conductive pigments, with the result that external electromagnetic fields do not impair the operating device, or impair it less, and at the same time the operating device electromagnetically impairs the environment less. At the same time, the electrodes can capture the inputs by the operator of the operating apparatus undisturbed, since no conductive pigments interfere with the electric field between them and the operator.

If the capacitive input surface includes a transparent material, an electro-optical display can be arranged adjacently or at a distance on the side of the input surface facing away from the operator of the operating device, and the capacitive input surface can thus be part of a touchscreen.

Without an electro-optical display, the capacitive input surface can be part of a touchpad or of a capacitive key.

A black-colored object with an electromagnetic field function can, for example, also be embodied as a transmitting and/or receiving unit for electromagnetic radiation, in the form of an antenna, for example. This transmitting and/or receiving unit for electromagnetic radiation is then covered with a component with a non-conductive pigment, wherein the component can be embodied in the form of a lacquer layer of the antenna or as a separate component into which the antenna is inserted.

A black-colored object with an electromagnetic field function can, for example, also be embodied in the form of a radar transmitting and/or receiving unit. This radar transmitting and/or receiving unit is then covered with a component with a non-conductive pigment, wherein the component can be embodied in the form of a lacquer layer of the radar transmitting and/or receiving unit or as a separate component into which the radar transmitting and/or receiving unit is inserted or with which the radar transmitting and/or receiving unit is covered.

A black-colored object with an electromagnetic field function can, for example, also have a coating with lacquers or have a covering with components that are not formed homogeneously but rather have first partial surfaces that allow the electromagnetic radiation to pass through unhindered or almost unhindered and have second partial surfaces that strongly attenuate or even shield the electromagnetic radiation, wherein the first partial surfaces advantageously surround the second partial surfaces or are surrounded by the second partial surfaces. Such a black-colored object can, for example, also be embodied in the form of a radar transmitting and/or receiving unit. The design of the first and second partial surfaces allows the radar transmitting and/or receiving unit to be changed in terms of its transmitting and/or receiving characteristics.

If certain impairments of the black-colored object with an electromagnetic field function are permissible, it is possible to also use conductive pigments in addition to the non-conductive pigments, wherein the different pigments can be mixed or used in adjacent components. The statements made regarding the objects with electric field functions can be applied correspondingly.

Other objects, features and characteristics of the present invention, as well as the methods of operation and the functions of the related elements of the structure, the combination of parts and economics of manufacture will become more apparent upon consideration of the following detailed description and appended claims with reference to the accompanying drawings, all of which form a part of this specification. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The invention will be explained in more detail below on the basis of the figures. In the figures:

FIG. 8 illustrates a first exemplary embodiment for a backlit day design.

FIG. 9 illustrates a second exemplary embodiment for a backlit day design.

FIG. 10 illustrates a third exemplary embodiment for a backlit day design.

DETAILED DESCRIPTION

Figure 1:
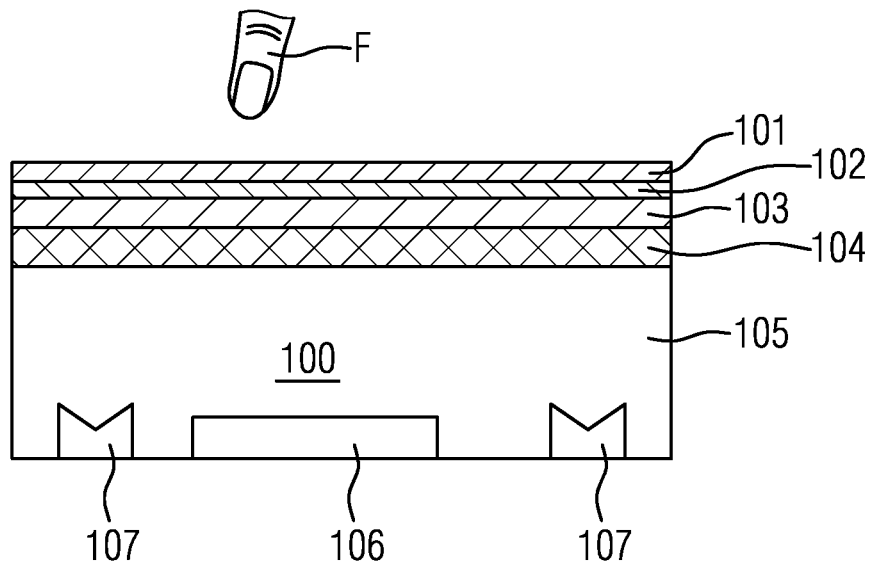
FIG. 1 shows an exemplary embodiment of a black-colored object in the form of an operating apparatus.

FIG. 1 shows an operating apparatus 100 and a finger F belonging to an operator. The operating apparatus 100 has a capacitive input surface, wherein the capacitive input surface has a first component 101, electrodes 102, and a second component 103. The operating apparatus 100 furthermore has an electro-optical display 104 in the form of an LCD, for example, a housing 105, an electronic control device 106, and an illumination apparatus in the form of light-emitting diodes 107. The first component 101, the electrodes 102, and the second component 103 are embodied to be at least partially transparent so that the electro-optical display 104 and any information represented thereon are perceivable by the operator through the capacitive input surface. The component 101 has non-conductive pigments, and the component 103 has pigments that are all conductive. The electronic control apparatus 106 is thus shielded from external magnetic fields and cannot itself emit any electromagnetic interference through the capacitive input surface 101, 102, 103.

The changes in the electric field caused by the finger F can be captured through the component 101 by the electrodes 102 and processed by the electronic control apparatus 106 without the pigments of the component 101 impairing the capturing. In the present example, the components 103 and 101 can be embodied in the form of lacquer layers, wherein the lacquer layer 103 is then applied on the electro-optical display 104.

If no electro-optical display 104 or some other carrier material is present, at least one of the components 101 or 103 is embodied in the form of a plate, for example made of glass colored by means of pigments or of plastic colored by means of pigments. The electrodes 102 can be applied on the component 101 and/or 103 and for example consist of indium tin oxide (ITO).

Alternatively, the electrodes can also be embodied in the form of printed or vapor-deposited metal grid structures, printed conductive lacquers based on at least one of the substances silver nanowires, PEDOT:PSS, carbon nanotubes, or graphene. Two-dimensional thin layers made of metal or conductive metal oxides are also conceivable as electrodes or antenna material.

The light-emitting diodes 107 serve for transillumination and thus improve the readability of the LCD. The electro-optical display can also be embodied in the form of an OLED, MicroLED, or cathode-ray tube, for example. Then, no additional illumination is required.

In principle, a distance between the respective illustrated adjacent components 101-104 is also possible, but the visual appearance of the screen with capacitive input functionality is then no longer so appealing. Without an electro-optical display 104, the capacitive input surface 101, 102, 103 can serve as a touchpad.

Figure 2:
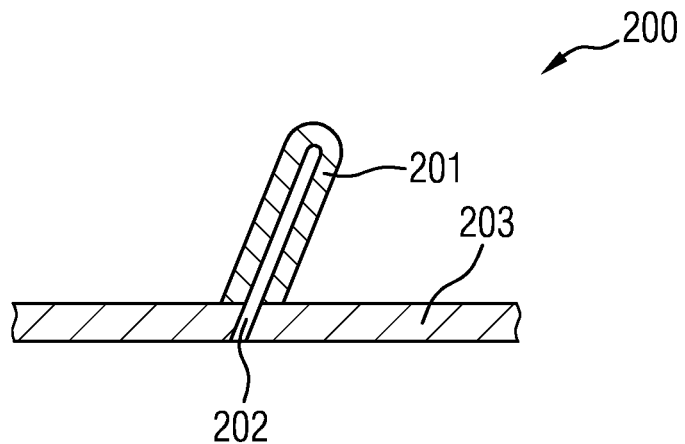
FIG. 2 shows an exemplary embodiment of a black-colored object in the form of an antenna.

FIG. 2 shows an antenna 200, which has the transmitting and/or receiving unit for electromagnetic radiation in the form of an antenna 202, a lacquer layer 201, and a carrier plate 203. The lacquer layer 201 and the carrier plate 203 are each colored by means of pigments. The pigments of the lacquer layer 201 are not conductive so as not to impair the electromagnetic properties of the antenna 201. The pigments of the carrier plate 203 are for example conductive for cost reasons, but may also contain the pigments of the lacquer layer 201 for reasons of the visual appearance of the antenna including carrier.

Figure 3:
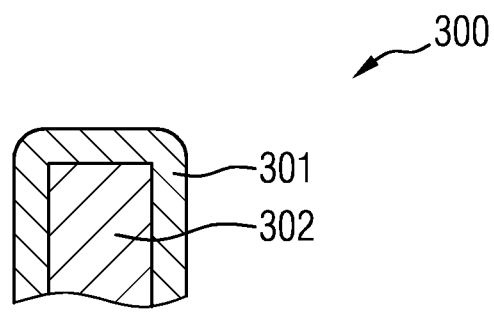
FIG. 3 shows a first exemplary embodiment of a black-colored object in the form of a radar sensor.

FIG. 3 shows a radar sensor 300, which has the radar transmitting and/or receiving unit in the form of a radar sensor 302 coated with a lacquer layer 301. The pigments of the lacquer layer 301 are preferably all non-conductive so as not to impair the properties of the radar sensor 302.

Figure 4:
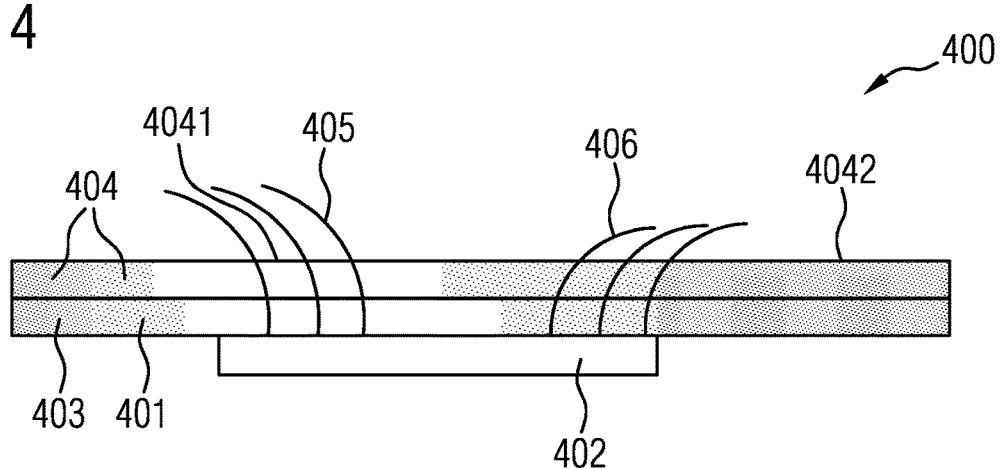
FIG. 4 shows a second exemplary embodiment of a black-colored object in the form of a radar sensor.

FIG. 4 shows a second exemplary embodiment of a radar sensor 400, which has the
radar transmitting and/or receiving unit in the form of a radar sensor 402 covered with a covering 401. The covering has a plate 403 that is provided with a print 404. This print 404 can be embodied, for example, as a screen print, flexographic print, gravure print, or digital print. It is also possible to correspondingly color the plate 403 in place of the print 404. The pigments of the print 404 are non-conductive in a first region and thus form the first partial surface 4041. They are shown in white in FIGS. 4-7. The pigments are conductive in a second region and thus form a second partial surface 4042. They are shown in black in FIGS. 4-7. The pigments of the first partial surface 4041 and of the second partial surface 4042 are black, with the result that a homogeneous black surface is visible to an observer of the plate 401 when the plate 401 is viewed from above.

In the exemplary embodiment according to FIG. 4, the first partial surface 4041 gradually merges into the second partial surface 4042. A sharply defined transition from the first partial surface to the second partial surface is also possible. Electromagnetic waves can penetrate the first partial surface 4041 almost unhindered, while they can penetrate the second partial surface 4042 only in a strongly attenuated manner or not at all. This creates a directional transmitting and/or receiving characteristic, as is shown by electromagnetic waves 405, 406.

Figure 5:
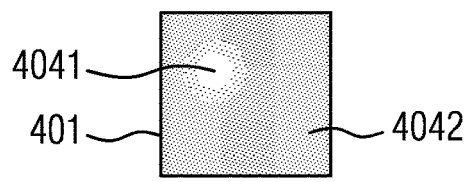
FIG. 5 shows a plan view of the exemplary embodiment from FIG. 4.

FIG. 5 shows that the first partial surface 4041 is surrounded by the second partial surface 4042, wherein the transition between the partial surfaces 4041, 4041 is embodied to be gradual.

Figure 6:
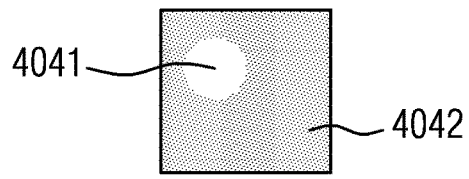
FIG. 6 shows a plan view of the exemplary embodiment from FIG. 5 in a modified version.

FIG. 6 shows that the first partial surface 4041 is likewise surrounded by the second partial surface 4042, wherein the transition between the partial surfaces 4041, 4042 takes place directly, without a transition region.

Figure 7:
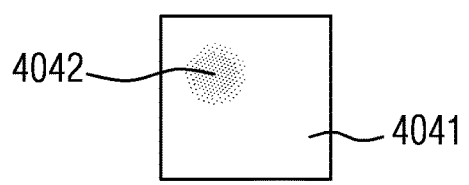
FIG. 7 shows a further plan view of the exemplary embodiment from FIG. 4 in another modified version.

FIG. 7 shows that the first partial surface 4041 surrounds the second partial surface 4042, wherein the transition between the partial surfaces 4041, 4041 is embodied to be gradual. In this way, a direction- or position-dependent separation can be implemented for a specific region.

Exemplary embodiments for day/night design in film components and in screen printing will be described below, such as are used, for example, in the instrument cluster or in other elements of the cockpit of a motor vehicle. In these, opaque and black prints also based on spinel are used. For example, the use of spinel pigments for translucent prints or coatings for use in disappearance effects will be shown.

A first one of said exemplary embodiments for a backlit day/night design that is invisible without illumination is shown in FIG. 8 by a sectional view through a print build-up made possible for a backlit day/night design.

The backlit day/night design of this first exemplary embodiment looks, for example, as shown at the bottom of FIG. 8.

A second one of said exemplary embodiments for a backlit day/night design that is visible without illumination is shown in FIG. 9 by a sectional view through a possible print build-up for a backlit day/night design.

The translucent black print can be realized with spinel or other pigments or colorants.

Night color can be omitted if the color impression when illuminated can be achieved by the color-imparting print or is produced by the light-emitting means.

The backlit day/night design of this second exemplary embodiment looks, for example, as shown at the bottom of FIG. 9.

A third one of said exemplary embodiments for a backlit day design is shown in FIG. 10 by a sectional view through a possible print build-up for a pure day design.

The color-imparting print can include a plurality of identical or different prints Plastic and touch sensor system can be transparent/translucent or opaque The unlit day design looks, for example, as shown at the bottom of FIG. 10 when viewed from above.

The foregoing preferred embodiments have been shown and described for the purposes of illustrating the structural and functional principles of the present invention, as well as illustrating the methods of employing the preferred embodiments and are subject to change without departing from such principles. Therefore, this invention includes all modifications encompassed within the scope of the following claims.

The invention claimed is:

1. A black-colored object having one of an electromagnetic and electric field function comprising:
   a data transfer function,
   wherein the black colored object is an operating apparatus with a capacitive input surface through which a user capacitive input is received,
   wherein the capacitive input surface is one of colored by pigments, covered with a component colored by pigments, and coated with a lacquer that includes and is colored by pigments, and
   wherein the capacitive input surface comprises:
      a layer with conductive pigments,
      a layer with non-conductive spinel pigments, the layers are arranged one of directly adjacent to one another and at a distance from one another, and
      a capacitive input electrode for receiving said user capacitive input.

2. The black-colored object as claimed in claim 1, wherein the non-conductive pigments are one of copper-chromium-iron-spinel pigments and chromium-iron-nickel-manganese-spinel pigments.

3. The black-colored object as claimed in claim 1, wherein the capacitive input surface includes a transparent material.

4. The black-colored object as claimed in claim 3, wherein the transparent material is colored by pigments.

5. The black-colored object as claimed in claim 1, wherein the operating apparatus has an electro-optical display that is one of arranged adjacent to and at a distance from the capacitive input surface.

* * * * *